United States Patent [19]

Faue

[11] Patent Number: 5,438,287
[45] Date of Patent: Aug. 1, 1995

[54] HIGH SPEED DIFFERENTIAL CURRENT SENSE AMPLIFIER WITH POSITIVE FEEDBACK

[75] Inventor: Jon A. Faue, Colorado Springs, Colo.

[73] Assignees: United Memories Inc., Colorado Springs, Colo.; Nippon Steel Semiconductor Corp., Chiba, Japan

[21] Appl. No.: 252,269

[22] Filed: Jun. 1, 1994

[51] Int. Cl.$^6$ ............................................. H03K 5/08
[52] U.S. Cl. .................................. 327/54; 327/55; 327/67; 327/312
[58] Field of Search ................... 307/530; 365/207; 327/54, 57, 67, 312, 316, 323, 374, 590, 55

[56] References Cited

U.S. PATENT DOCUMENTS

| | | | |
|---|---|---|---|
| 3,444,472 | 6/1967 | Johnson | 365/207 |
| 4,766,333 | 8/1988 | Mobley | |
| 5,162,681 | 11/1992 | Lee | 307/530 |
| 5,304,874 | 4/1994 | Vinal | 307/530 |

Primary Examiner—Timothy P. Callahan
Assistant Examiner—Jung Ho Kim
Attorney, Agent, or Firm—Edward D. Manzo

[57] ABSTRACT

Positive feedback increases switching speeds and negative feedback prevents the voltage at the inputs from varying too far in a sense amplifier used to sense voltage differentials on bit lines or data lines of semiconductor memories, or elsewhere. Switching speeds improve without increased current consumption.

13 Claims, 2 Drawing Sheets

HIGH SPEED DIFFERENTIAL CURRENT SENSE AMPLIFIER WITH POSITIVE FEEDBACK

TECHNICAL FIELD

This invention is directed to sensing amplifiers for semiconductor memories and in particular to an improved current sensing differential amplifier.

BACKGROUND OF THE INVENTION

Semiconductor memories are used to store information, often in conjunction with microprocessors. Typical memory devices are comprised of an array of memory cells together with various "peripheral" circuitry. Each memory cell is capable of storing usually just one datum, typically in binary format, a "1" or "0." The memory cells are arranged in rows and columns. Each row of memory cells corresponds to and is accessible by a word line, and each column of memory cells corresponds to and is accessible by bit lines, often a pair of bit lines. At or near each intersection of each row and bit line in the array is a respective memory cell. In order to write or read from a specific memory cell, the memory device must be told which cell to access. This is done by reading an address and decoding it into a row address and a column address. The row address is used to locate and activate the word line along which the specific memory cell resides. By activating the word line, all the memory cells associated with the row are coupled to their respective bit lines. The column address then allows only the bit line (pair) for the selected memory cell to be coupled to the data line pair, with the appropriate data being transferred between the two. In the case of a memory read, data will be transferred from the memory cells to the data lines. In the case of a memory write, the data will be transferred from the data lines to the memory cell. In this way, a specific memory cell is coupled to the data lines during a memory access.

During a memory read, the signal read from a memory cell creates a voltage differential. The voltage differential is small, typically in the range of 100-200 mV. Because the differential is small, it needs to be amplified before it can be used by the logic circuits in the stages that follow. The amplification is achieved, often in multiple stages, by sense amplifiers. If the amplifier inputs are connected to data lines, the amplifier is called a sense amplifier. If the amplifier inputs are connected to bit lines, the amplifier is a sense amplifier often called a pre-sense amplifier.

Conventional sense amplifiers sense the voltage differential between the two input lines and amplify it. However, because bit lines and data lines are capacitively loaded, there is a delay in transmitting an applied voltage differential to the sense amplifiers. This results in an overall increase in the time required to read data from a memory cell.

While the voltage responds slowly, the current changes almost instantly. Because of this, current sensing differential amplifiers have been developed, which sense current differentials between two input lines, as opposed to voltage differentials. In this way, circuits can respond much more quickly to changes on bit lines or data lines. A good description of current sensing differential amplifiers is provided in U.S. Pat. No. 4,766,333 owned by Inmos Corporation and entitled "Current Sensing Differential Amplifiers" the disclosure of which is incorporated hereby.

FIG. 1 shows a current sensing differential amplifier in the prior art and is an improvement over initial current sensing differential amplifiers. FIG. 1 shows an amplifier circuit 10 which includes a reference voltage circuit 11, a first input terminal 12, a second input terminal 14, a first negative feedback transistor 30, a second negative feedback transistor 32, with the remaining portion of the circuit generally acting as a voltage amplifier.

Input terminal 12 is coupled to the sources of p-channel transistors 22 and 24. Input 14 is coupled to the sources of p-channel transistors 26 and 28. The gates of transistors 22, 34, 26, and 44 and the drains of transistors 26 and 44 are connected to a first node 48. The gates of transistors 24, 28, 36, and 42 and the drains of transistors 24 and 42 are connected to a second node 46. The drain of transistor 22 is coupled to ground (a source voltage) through a load transistor 34 and a first output terminal 38. Similarly, the drain of transistor 28 is coupled to ground through a load transistor 36 and to a second output terminal 40. Node 46 is coupled to ground through a load transistor 42. Node 48 is similarly coupled to ground through a load transistor 44. Circuit 10 additionally includes two p-channel transistors 30 and 32. Transistor 30 couples first input terminal 12 to VCC (a second source voltage). Transistor 32 couples second input terminal 14 to VCC. Transistors 30 and 32 serve as impedance loads to sense changes in the memory array being applied to input terminal 12 and 14. The gates of transistors 30 and 32 are coupled to output terminals 38 and 40, respectively. By coupling the gates of both transistors 30 and 32 to the output terminals, both transistors 30 and 32 provide negative feedback to insure both input terminals are kept relatively close in terms of voltage. Negative feedback will be discussed in more detail infra.

The relative sizes of transistors 22, 24, 26 and 28 as well as the relative sizes of transistors 34, 36, 42 and 44 are important. The channels of transistors 22, 24, 26 and 28 are quite large so they can be biased in saturation, draw lots of current, and be insensitive to variations in current and voltage across their drains and sources. The channels of transistors 34, 36, 42 and 44 are smaller, so they are sensitive to changes in current and voltage across their drains and sources.

Current sensing amplifier circuit 10 operates by receiving (as inputs) signals from a pair of data lines (or bit lines). Assume a starting state of data "0" is initially present on the data lines. The voltage of input 12 is less than the voltage of input 14. As the data state changes, due to an address change or similar event, the voltage of input 12 will attempt to rise or become greater than the voltage of input 14, which will attempt to fall. The voltage change will be slow due to a large line capacitance present on the data lines. If the sense amplifier were to react to a voltage change, the output would similarly respond slowly. While the voltages change very slowly, the currents being driven by the data lines change almost instantly.

As the voltage at the data line connected to input 14 tries to fall, it will cause current to flow away from the amplifier circuit into the data line. Because the voltage remains unchanged on input 14 due to the capacitance, the voltage from drain to source and the voltage from gate to source of transistor 32 remain unchanged. Consequently, current supplied through transistor 32 will also remain unchanged. The extra current being drawn away from the circuit through input 14 results in less current flowing through transistors 26 and 28. The current flowing through transistor 44 will similarly drop, because the current through transistor 44 equals the current through transistor 26.

Circuit 10 has been designed so that the size of transistors 36 and 44 have smaller channels that are more sensitive to changes in both current and voltage. This means that their width/length ratio is smaller. The smaller ratio gives a transistor a higher impedance when conducting. Because of the higher impedance in transistor 44, the voltage across transistor 44 will drop to a greater degree in response to a current drop. This results in the voltage of internal reference node 48 dropping. Because transistor 26 is relatively large, operating in saturation, internal reference node 48 can drop a large amount without affecting the current through transistor 26 or the voltage at input 14.

As the voltage of internal reference node 48 decreases, the gate to source voltage of transistor 34 also decreases. This allows the voltage of output 38 to rise. The gate to source voltage of transistor 22 increases, but because the size of transistor 22 is relatively large, it remains in saturation and the voltage of output 38 can rise without affecting the operation of transistor 22.

Similar to the voltage of input 14, the voltage of input 12 will be slow to change because of the high capacitance associated with the data lines. This results in transistor 30 continuing to supply the same amount of current. The extra current available from the reduced current consumption of input 12 will be supplied to transistors 22 and 24. The current increase in transistor 24 will cause an increase in the current of transistor 42. The sizing of the channel of transistor 42 will cause the voltage of internal reference node 46 to rise. The increase in voltage on internal reference node 46 will cause output 40 to be coupled more strongly to ground through transistor 36.

In this way, a voltage differential is seen on outputs 38 and 40 in response to changes in current at inputs 12 and 14.

Circuit 10 additionally includes negative feedback supplied by transistors 30 and 32. For example, as the voltage of output 40 decreases as a result of input 14 drawing more current, the gate to source voltage of transistor 32 increases. This turns transistor 32 on harder, which influences the voltage of input 14 upward. This is opposite to the influence being exerted by the data lines. This keeps the voltage differential between input 12 and input 14 to a minimum. By keeping the voltage differential of inputs 12 and 14 to a minimum, future switches occur much more quickly and easily.

However, circuit 10 does have inherent qualities that degrade switching performance. During the switching described above, the voltage of internal reference node 46 increases as a result of increased current through transistor 42. As internal reference node 46 increases in voltage, the gate to source voltage of transistor 42 increases. This causes transistor 42 to turn on harder, reducing the resistance through transistor 42 with which internal reference node 46 is coupled to ground. This is negative feedback associated with the internal reference nodes and reduces the speed at which the circuit can switch by limiting the speed at which the voltage of internal reference node 46 can rise. Internal reference node 48 is similarly affected in the opposite direction.

It is therefore an object of the invention to provide an improved current source amplifier by removing the negative feedback associated with the internal reference nodes, and changing it into positive feedback in order to accelerate the amplifier switching times.

SUMMARY OF THE INVENTION

The present invention is directed to an improved current sense amplifier for detecting a change in differential currents. The present invention is particularly well suited for sensing current differentials in bit lines and data lines of semiconductor memories.

The present invention incorporates positive feedback during the time when the circuit switches in response to reading a different value. This facilitates a much faster response to current differentials at the circuit input. In a more specific application in the area of semiconductor memories, the present invention can be used to sense current differentials on pairs of bit lines and pairs of data lines allowing for much faster memory reads.

One of the important features of the present invention is that faster circuit operation is achieved without increasing the power requirements of the circuit.

A method aspect of the present invention includes steps for developing a voltage differential at two output terminals based on a current differential at two input terminals. The current differential at the two inputs results from the impedance related to the state of an addressed memory cell. The voltage differential at the two outputs has its creation accelerated by positive feedback and its magnitude controlled by negative feedback.

BRIEF DESCRIPTION OF THE DRAWINGS

In describing the present invention, reference is made to the accompanying drawings wherein.

DESCRIPTION OF THE PREFERRED EMBODIMENTS

Figure 1:
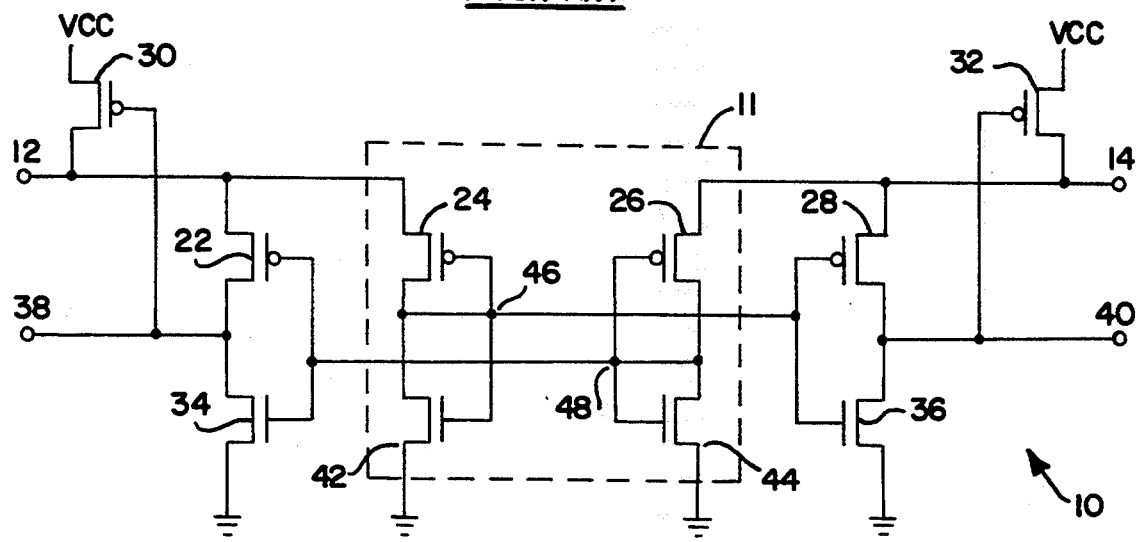
FIG. 1 is a circuit diagram of a current sense amplifier in the prior art.
Figure 2:
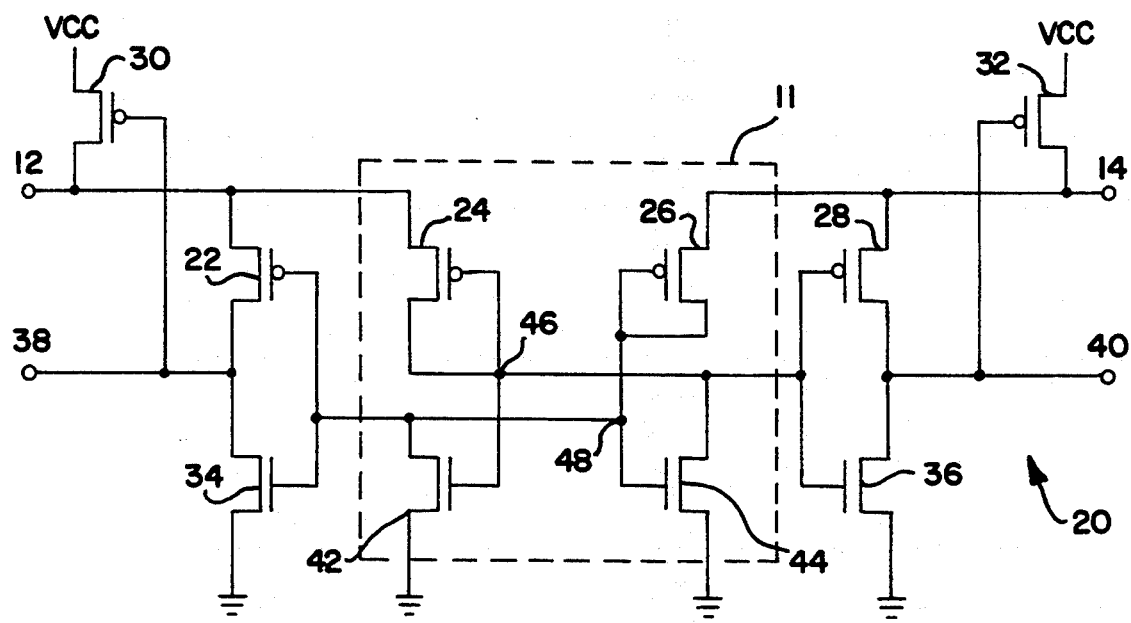
FIG. 2 is a circuit diagram illustrating an improved current sense amplifier in accordance with the present invention.

FIG. 2 shows a current sensing differential amplifier 20 according to the present invention. The circuit of FIG. 2 is based upon FIG. 1 and numbers for like components shown in FIG. 1 are similarly numbered in FIG. 2. Generally, the circuit has been modified to include positive feedback. Transistors 42 and 44 are reconfigured, by alternatively coupling their drains. The drain of transistor 42 is uncoupled from internal reference node 46 and coupled to internal reference node 48. Similarly, the drain of transistor 44 is uncoupled from internal reference node 48 and coupled to internal reference node 46.

The general circuit operation of circuit 20, shown in FIG. 2, is the same as the general circuit operation of circuit 10 of the prior art, shown in FIG. 1. However, the change is significant in overcoming the inherent limitations in switching present in circuit 10. Circuit 10 contains the undesirable limitations associated with transistors 42 and 44. As configured in circuit 10, transistors 42 and 44 self limit themselves in their ability to modify the internal reference nodes 46 and 48. This results in slower switching speeds for the amplifier.

In the prior art circuit 10, when the current in transistor 24 increases, the voltage of internal reference node 46 increases. This causes transistor 42 to turn on harder due to the increase in gate to source voltage of transistor 42. Transistor 42 has the effect of influencing the voltage of internal reference node 46 downward. However, it is preferable for the voltage of internal reference node 46 to rise with the effect of turning transistor 36 on harder. This would result in a faster response time for the sense amplifier. While ultimately in the prior art the voltage of internal reference node 46 does rise, the voltage rises much slower because of the downward influence.

In circuit 20, an embodiment of the present invention, the drain of transistor 42 is connected to internal reference node 48. As the voltage on node 46 rises, transistor 42 turns on harder, but not coupling node 46 to ground, as it did in the prior art. Instead, transistor 42 turns on harder, coupling node 48 to ground with more strength. As shown in FIG. 2, node 48 is connected to the gate electrode of transistor 34. Therefore, coupling node 48 to ground encourages the speed at which transistor 34 turns off, thereby allowing the voltage of output 38 to rise.

Switching the connection of the drain of transistor 44 to internal reference node 46 (as in FIG. 2) similarly enhances circuit switching speeds. As the voltage of internal reference node 48 decreases, transistor 44 turns down (closer to off). Instead of decreasing the strength at which node 48 is coupled to ground (as in the prior art), transistor 44 now decreases the strength with which it pulls internal reference node 46 to ground. This encourages the speed at which the amplifier switches by accelerating how fast transistor 36 turns on, coupling output 40 closer to ground. These uses of positive feedback enhance the switching speeds of the amplifier 20, allowing for faster data accesses in semiconductor memories. I use the term "positive feedback" for the following reason. If node 12 drops (in voltage), (a) this causes node 46 to drop. This causes (b) the gate-source voltage of device 42 to decrease. This causes (c) the voltage at node 48 to increase. As node 48 increases, the (d) the gate-source voltage of device 44 increases. When this happens, this causes (e) node 46 to drop in voltage. Since the result (e) is the same as (a), this is a feedback loop tending to increase its effect, and therefore it should be called "positive feedback."

Positive feedback can be dangerous. The gain can be so great that when fed back it leads to circuit instability: A situation in which the circuit switches so strongly that it cannot switch back. Transistors 30 and 32 provide negative feedback that prevents potential circuit instability. As described earlier, transistors 30 and 32 provide negative feedback which prevents inputs 12 and 14 from varying in voltage significantly. If outputs 38 and 40 try to switch too far, then either transistor 30 or transistor 32 will turn on harder to stop the process.

While the negative feedback created by transistors 30 and 32 enhances circuit stability, it does not adversely affect the speed at which the amplifier switches. This is because the negative feedback regulates the voltages at inputs 12 and 14, not the currents. The positive feedback begins when the circuit begins to switch as a result of differences in current before a significant difference in voltage appears on the inputs 12 and 14. The negative feedback does not begin until there is a difference in voltage. This provides a beneficial mix of positive feedback, to encourage and speed up actual switching, and negative feedback, to maintain circuit stability and to minimize voltage differential of the inputs for faster switches in the future. The negative feedback is primarily active after the switch takes place.

It will be understood that the present invention, as expressed in the above-mentioned non-limiting embodiment, can alternatively be configured by the p-channel transistors replaced with n-channel transistors, the n-channel transistors replaced by p-channel transistors, and the polarity of the source voltages switched, i.e. the first source voltage is switched to VCC and the second source voltage is switched to ground.

Figure 3:
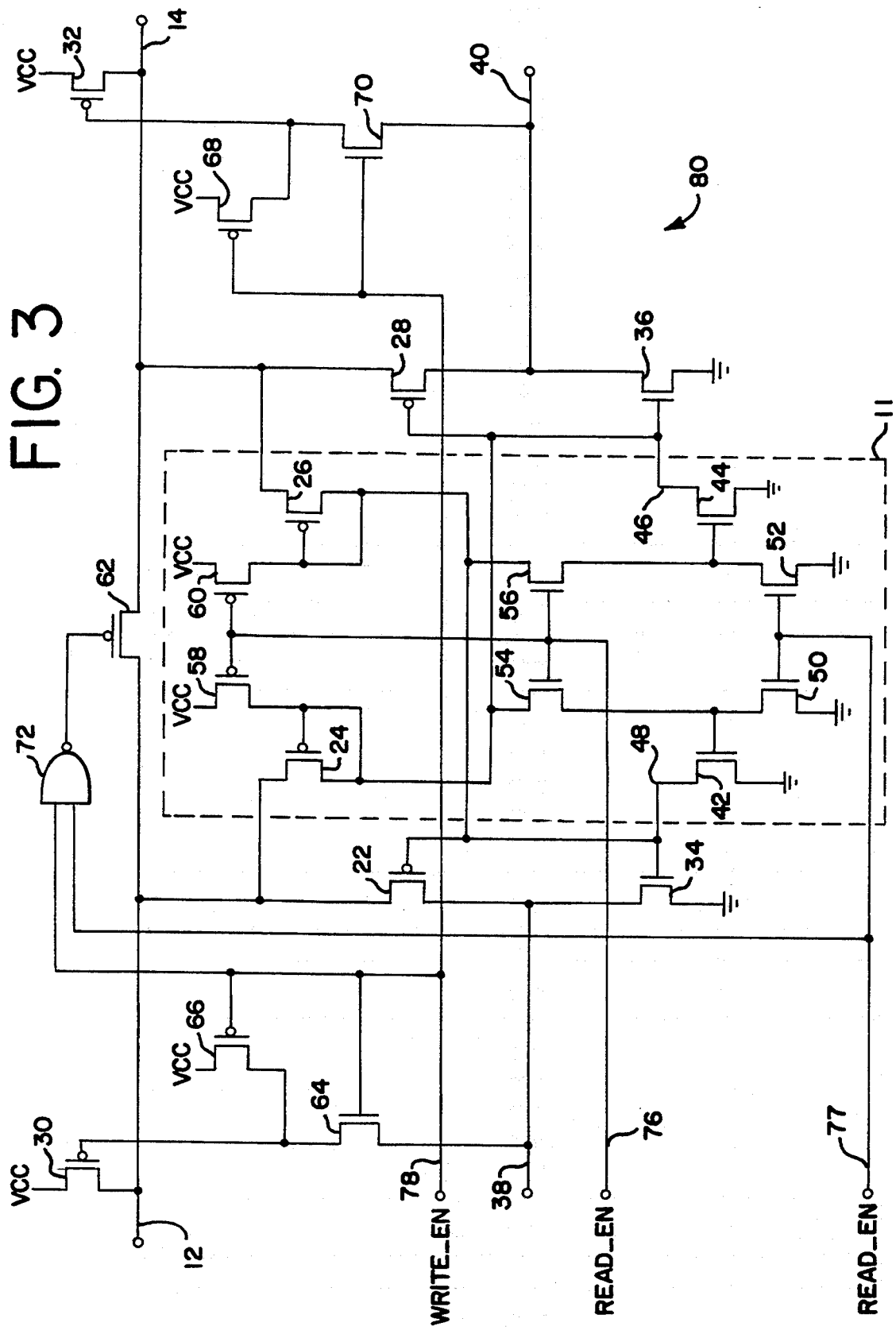
FIG. 3 is a more detailed schematic diagram illustrating an improved current sense amplifier particularly well suited for application in semiconductor memory devices.

FIG. 3 shows a current sensing differential amplifier 80, according to the present invention, particularly well suited for application in semiconductor memory devices. The circuit of FIG. 3 is based upon FIG. 2 and numbers for like circuit components shown in FIG. 2 are similarly numbered in FIG. 3. Circuit 80 includes additional circuitry associated with both write enable and read enable.

FIG. 3 additionally receives three signals, READ-EN 76, /READ-EN 77 and /WRITE-EN 78. The signal READ-EN 76 is active high when the memory cell array is enabled to be read from. The signal /READ-EN 77 is the complement of signal READ-EN 76. Signal /READ-EN 77 is low when the memory cell array is enabled to be read from. The signal /WRITE-EN is low when the memory cell array is enabled to be written to.

FIG. 3 additionally includes eleven transistors and one NAND gate. Six transistors, 50, 52, 54, 56, 58 and 60 are associated with the signals READ-EN 76 and /READ-EN 77. Four transistors, 64, 66, 68 and 70 are associated with the signals /WRITE-EN 78. NAND gate 72 is used to determine when the memory cell is not enabled to be read or written, and is used to control transistor 62.

The additional transistors and NAND gate modify circuit 20 of FIG. 2, previously described, in the following way. The gate of transistor 42 is no longer directly coupled to internal reference node 46. The gate of transistor 42 is now coupled to internal reference node 46 through transistor 54 and the gate of transistor 42 is coupled to ground through transistor 50. Similarly, the gate of transistor 44 is coupled to internal reference node 48 through transistor 56 and the gate of transistor 44 is coupled to ground through transistor 52. The gates of both transistors 50 and 52 are coupled to signal /READ-EN 77. The gates of both transistors 54 and 56 are coupled to signal READ-EN 76. Internal reference node 48 is coupled to VCC through transistor 60. Internal reference node 46 is coupled to VCC through transistor 58. The gates of both transistors 58 and 60 are coupled to signal READ-EN 76. The gate of transistor 30, which provides negative feedback, is coupled to output 38 through transistor 64 and is coupled to VCC through transistor 66. The gate of transistor 32, which also provides negative feedback, is coupled to output 40 through transistor 70 and is coupled to VCC through transistor 68. The gates of transistors 64, 66, 68 and 70 are coupled to signal /WRITE-EN 78. And finally, input 12 is coupled to input 14 through transistor 62. The gate of transistor 62 is coupled to the output of NAND gate 72. NAND gate 72 has one input coupled to /WRITE-EN 78 and the other input coupled to /READ-EN 77.

The sense amplifier circuit 80 needs to function, similar to circuit 20 described above, only when a memory cell is being read. So when a memory cell is to be read from, signal READ-EN 76 goes high and signal /READ-EN 77 goes low. During a read operation, signal /WRITE-EN 78 is high. This keeps transistors 66 and 68, which are p-channel transistors with their gates coupled to signal /WRITE-EN, in an off condition. Transistors 50, 52, 58, 60 and 62 are similarly off. Transistors 54, 56, 64 and 70 are on. During a read operation, circuit 80 is functionally equivalent to circuit 20.

During a write operation, sense amplifier circuit 80 is not needed to sense the current value stored in the addressed memory cell. The addressed memory cell is going to be written to and its current value updated. When a memory cell is written to, signal /WRITE-EN 78 goes low. Signal READ-EN 76 is low and signal /READ-EN 77 is high. This puts the sense amplifier in an inactive or stand-by mode. Output signals 38 and 40 are both coupled to ground. Transistors 58 and 60 are turned on coupling both internal reference nodes 46 and 48 to VCC. This turns off transistors 22, 24, 26 and 28, and turns transistors 34 and 36 on. By turning on transistors 34 and 36, both output signals 38 and 40 are coupled to ground. Transistors 54 and 56 are off, decoupling the gates of transistors 42 and 44 from their respective internal reference nodes 48 and 46. Transistors 50 and 52 are on, coupling the gates of transistors 42 and 44 to ground. As a result, transistors 42 and 44 are off. Input terminals 12 and 14 are decoupled from the rest of the circuit. Transistors 70 and 64 are off, decoupling the gate of transistors 30 and 32 from the output terminals 38 and 40. Transistors 66 and 68 are on, coupling the gates of both transistors 30 and 32 to VCC. By coupling the gates of transistors 30 and 32 to VCC, transistors 30 and 32 are turned off. Transistor 62 is off as a result of the output of NAND gate 72 being high.

In summary, during a write operation, the current sense amplifier is effectively isolated from the memory cell array. The input terminals 12 and 14 are decoupled from the rest of the current sense amplifier circuit 80. The output terminals 38 and 40 are coupled to ground.

During neither a memory read nor a memory write, signal READ-EN 76 is low, and signals /READ-EN 77 and /WRITE-EN 78 are both high. In this instance, both inputs to NAND gate 72, /READ-EN 77 and /WRITE-EN 78, are high resulting in an output whose value is low. Transistor 62 is on coupling input terminal 12 to input terminal 14. This effectively removes any voltage difference between the two input terminals 12 and 14 allowing for a faster read during the next memory read.

Both FIG. 2 and FIG. 3 represent an improved current sense amplifier in accordance with the present invention. It is to be noted that one of the circuit features allows for a faster sensing of current differentials without an increase in power consumption.

While this invention has been described with reference to an illustrative embodiment, it will be understood that this description is not intended to be construed in a limiting sense, but is intended to include any substitutes within the scope of the invention. Various modifications of the illustrative embodiment, as well as other embodiments, will become apparent to those skilled in the art upon reference to this description. The invention is intended to be set forth in the following claims.

What is claimed is:

1. An amplifier for a semiconductor circuit comprising:
   first and second inputs;
   first and second outputs;
   first and second circuit paths each coupling a first source voltage to a second source voltage;
   a reference voltage circuit comprising first and second reference nodes and third and fourth circuit paths;
   wherein said first circuit path comprises first, second and third transistors,
   said first transistor having its source-drain path coupled between said first input and said first output and its control electrode coupled to said first reference node,
   said second transistor having its source-drain path coupled between said first input and said first source voltage and its control electrode coupled to said first output to provide negative feedback, and
   said third transistor having its source-drain path coupled between said first output and said second source voltage and its control electrode coupled to said first reference node;
   wherein said second circuit path comprises fourth, fifth, and sixth transistors,
   said fourth transistor having its source-drain path coupled between said second input and said second output and its control electrode coupled to said second reference node,
   said fifth transistor having its source-drain path coupled between said second input and said first source voltage and its control electrode coupled to said second output to provide negative feedback, and
   said sixth transistor having its source-drain path coupled between said second output and said second source voltage and its control electrode coupled to said second reference node;
   wherein said third circuit path of said reference circuit is coupled between said first input to said second source voltage and comprises a first impedance and a seventh transistor,
   said first impedance being coupled between said first input and said second reference node, and
   said seventh transistor having its source-drain path coupled between said second reference node and said second source voltage with its control electrode coupled to said first reference node to provide positive feedback; and
   wherein said fourth circuit path of said reference circuit is coupled between said second input to said second source voltage and comprises a second impedance and an eighth transistor,
   said second impedance being coupled between said second input and said first reference node, and
   said eighth transistor having its source-drain path coupled between said first reference node and said second source voltage with its control electrode coupled to said second reference node to provide positive feedback.

2. An amplifier according to claim 1 wherein said first impedance is comprised of a ninth transistor and said second impedance is comprised of a tenth transistor;
   said ninth transistor having its source-drain path coupled between said first input and said second reference node and its control electrode coupled to said second reference node; and
   said tenth transistor having its source-drain path coupled between said second input and said first reference node and its control electrode coupled to said first reference node.

3. An amplifier according to claim 2 wherein said first, second, fourth, fifth, ninth and tenth transistors are p-channel transistors; and
wherein said third, sixth, seventh and eighth transistors are n-channel transistors.

4. An amplifier according to claim 3 wherein said first, fourth, ninth, and tenth transistors are sized so that they operate in saturation and are insensitive to voltage variations between their drains and sources.

5. An amplifier according to claim 3 wherein said third, sixth, seventh, and eighth transistors are sized so that they are sensitive to both small changes in current and voltage variations between their drains and sources.

6. The amplifier according to claim 2 wherein said first, second, fourth, fifth, ninth and tenth transistors are n-channel transistors; and
wherein said third, sixth, seventh and eighth transistors are p-channel transistors.

7. An amplifier according to claim 6 wherein said first, fourth, ninth, and tenth transistors are sized so that they operate in saturation and are insensitive to voltage variations between their drains and sources.

8. An amplifier according to claim 6 wherein said third, sixth, seventh, and eighth transistors are sized so that they are sensitive to both small changes in current and voltage variations between their drains and sources.

9. The amplifier according to claim 1 wherein said first and second inputs are coupled to a pair of bit lines.

10. The amplifier according to claim 1 wherein said first and second inputs are coupled to a pair of data lines.

11. A method for sensing a state of a memory cell comprising the steps of:
developing different currents at two inputs of an amplifier based upon impedances related to the state of said memory cell;
developing voltage transitions in said amplifier in accordance with said pair of different currents;
accelerating said voltage transitions in said amplifiers by positive feedback therein;
wherein said positive feedback responds to said different currents developed at said two inputs;
controlling voltages at said inputs by negative feedback; and
developing differential voltages at two outputs of said amplifier based on said pair of different currents.

12. The method according to claim 11 wherein said two inputs are coupled to a pair of bit lines.

13. The method according to claim 12 wherein said two inputs are coupled to a pair of data lines.

* * * * *